(12) United States Patent
Tega et al.

(10) Patent No.: US 7,709,315 B2
(45) Date of Patent: May 4, 2010

(54) SEMICONDUCTOR DEVICE AND METHOD OF MANUFACTURING THE SAME

(75) Inventors: Naoki Tega, Kokubunji (JP); Hiroshi Miki, Tokyo (JP); Yasuhiro Shimamoto, Tokorozawa (JP); Digh Hisamoto, Kokubunji (JP); Tetsuya Ishimaru, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 233 days.

(21) Appl. No.: 11/773,842

(22) Filed: Jul. 5, 2007

(65) Prior Publication Data

US 2008/0048249 A1 Feb. 28, 2008

(30) Foreign Application Priority Data

Aug. 25, 2006 (JP) ............................. 2006-228828

(51) Int. Cl.
*H01L 21/8238* (2006.01)
(52) U.S. Cl. ............... 438/201; 438/211; 257/E21.179; 257/E21.422
(58) Field of Classification Search ................. 438/201, 438/211, 257, 258, 593; 257/E21.179, E21.422, 257/E21.68
See application file for complete search history.

(56) References Cited

U.S. PATENT DOCUMENTS

| 7,001,814 | B1 * | 2/2006 | Halliyal et al. ............... 438/287 |
| 2004/0132247 | A1 | 7/2004 | Kasuya |
| 2005/0230736 | A1 | 10/2005 | Ishimaru et al. |
| 2006/0131642 | A1 | 6/2006 | Iwata et al. |
| 2007/0090430 | A1* | 4/2007 | Nakano et al. ............... 257/296 |

FOREIGN PATENT DOCUMENTS

| CN | 1677675 A | 10/2005 |
| JP | 2001-168219 A | 6/2001 |
| JP | 2003-046002 A | 2/2003 |
| JP | 2004-152955 A | 5/2004 |
| JP | 2004-186663 A | 7/2004 |
| JP | 2004-363122 A | 12/2004 |

OTHER PUBLICATIONS

Rebecca Mih, et al. "0.18um Modular Triple Self-Aligned Embedded Split-Gate Flash Memory" 2000 Symposium on VLSI Technology Digest of Technical Papers, pp. 120-121.
Wei-Ming Chen "A Novel Flash Memory Device with Split Gate Source Side Injection and ONO Charge Storage Stack (SPIN)," 1997 Symposium on VLSI Technology Digest of Technical Papers, pp. 63-64.

* cited by examiner

*Primary Examiner*—Hoai v Pham
(74) *Attorney, Agent, or Firm*—Miles & Stockbridge P.C.

(57) ABSTRACT

An interface between a bottom oxide film and a silicon nitride film in a neighborhood of a bottom part of a select gate is located at a position as high as or higher than that of an interface between a silicon substrate (p-type well) and a gate insulating film ($d \geq 0$) Further, the gate insulating film and the bottom oxide film are successively and smoothly jointed in the neighborhood of the bottom part of the select gate. By this configuration, localization in a distribution of electrons injected into the silicon nitride film in the writing is mitigated and electrons to be left unerased by hot-hole erasing are reduced. Therefore, not only the increase ratio of the electrons left unerased in the writing can be reduced, but also the problem in which the threshold voltage does not decrease to the predetermined voltage in the deletion can be suppressed.

8 Claims, 17 Drawing Sheets

SEMICONDUCTOR DEVICE AND METHOD OF MANUFACTURING THE SAME

CROSS-REFERENCE TO RELATED APPLICATION

The present application claims priority from Japanese Patent Application No. JP 2006-228828 filed on Aug. 25, 2006, the content of which is hereby incorporated by reference into this application.

TECHNICAL FIELD OF THE INVENTION

The present invention relates to a technique for manufacturing a semiconductor device. More particularly, the present invention relates to a technique effectively applied to a semiconductor device having an electrically rewritable non-volatile memory and a method of manufacturing the same.

BACKGROUND OF THE INVENTION

A semiconductor device in which an electrically rewritable non-volatile memory and a microcomputer are embedded on a single silicon substrate has been widely used as an embedded microcomputer for industrial machines, home appliances, in-vehicle devices and the like.

The non-volatile memory of the semiconductor device described above stores therein a program required by the microcomputer and uses it as needed. As a cell structure of such a non-volatile memory suitable for embedding, there is a split-gate memory cell in which a select MOS (Metal Oxide Semiconductor) transistor and a memory MOS transistor are connected in series.

Among the split-gate memory cells, especially, a memory cell structure in which a gate electrode of the memory MOS transistor (hereinafter, referred to as memory gate) is arranged on a sidewall of a gate electrode of the select MOS transistor (hereinafter, referred to as select gate) by using self-alignment technique can reduce the gate length of the memory gate to be equal to or shorter than the minimum resolution of lithography. Therefore, fine memory cells can be realized compared to a memory cell structure in which the select gate and memory gate are independently formed by etching using a photoresist film as a mask (e.g., Japanese Patent Application Laid-Open Publication No. 2003-046002 (Patent Document 1) and "1997 Symposium on VLSI Technology Digest of Technical Papers (1997) pp. 63-64" (Non-Patent Document 1)).

Of the two kinds of MOS transistors which configure the split-gate memory cell, the memory MOS transistor stores information by holding charges in its gate insulating film. This charge-holding method mainly includes two types of methods. One is a floating-gate method in which a conductive polycrystalline silicon film isolated electrically is used for a part of the gate insulating film (e.g., Japanese Patent Application Laid-Open Publication No. 2004-363122 (Patent Document 2) and "2000 Symposium on VLSI Technology Digest of Technical Papers (2000) pp. 120-121" (Non-Patent Document 2)), and the other is a MONOS (Metal Oxide Nitride Oxide Semiconductor) method in which charges are accumulated in an insulating film such as a silicon nitride film having a property to store charges (e.g., Patent Document 1 and Non-Patent Document 1).

In both of the two types of charge-holding methods, a silicon oxide film having excellent insulation properties is inserted between a region to accumulate charges and a silicon substrate. However, in the floating-gate method, when leakage paths locally occur in the silicon oxide film, held charges leak toward the substrate side through these leakage paths, which poses a problem that the held charges cannot be maintained. On the other hand, in the MONOS method, since held charges are spatially discretized in the insulating film functioning as a charge-holding film, only the held charges in the periphery of leakage paths leak. Therefore, it has an advantage that extreme reduction in charge-holding life does not occur.

FIG. 28 shows the split-gate memory cell utilizing self-alignment technique, that is, a cross-sectional structure of a memory cell that adopts the MONOS method as its charge-holding method. The memory cell is comprised of a select MOS transistor and a memory MOS transistor. After a select gate 32 is formed, a memory gate 31 is formed on a sidewall of the select gate 32 in a self-alignment manner with interposing a gate insulating film 33 therebetween. A gate insulating film 34 of the select MOS transistor is comprised of a silicon oxide film. The gate insulating film 33 of the memory MOS transistor is comprised of a three-layered film of a bottom oxide film 33a as a first potential barrier film, a silicon nitride film 33b as a charge-holding film, and a top oxide film 33c as a second potential barrier film stacked in this order. Although not shown, the select gate 32 is connected to a select gate line, and the memory gate 31 is connected to a word line, respectively. Further, a source region 35 of the select MOS transistor is connected to a common source line, and a drain region 36 of the memory MOS transistor is connected to a data line, respectively.

In the writing to the memory cell, a predetermined voltage is applied to the drain region 36 and the memory gate 31 of the memory MOS transistor simultaneously with turning the select MOS transistor to an ON state. At this time, by setting the condition that a high electric field is generated in a boundary region between the select MOS transistor and memory MOS transistor, hot electrons occur on a surface of the silicon substrate 30 in this region and then part of them are injected to the memory gate 31 side (SSI: Source Side Injection). These injected hot electrons are trapped in the silicon nitride film 33b which is a part of the gate insulating film 33 of the memory MOS transistor, and the information is thus written. On the other hand, in the deletion of the information, a negative bias is applied to the memory gate 31 and a positive bias is applied to the drain region 36 to generate hot holes by interband tunneling injection, and the hot holes are injected into the silicon nitride film 33b to neutralize electrons (hot-hole erasing).

Further, in order to improve efficiency of the writing operation described above, a structure is known, in which a lower surface of the silicon nitride film 33b as the charge-holding film is located lower than an interface between the gate insulating film 34 of the select MOS transistor and the silicon substrate 1 as shown in FIG. 29 (e.g., Japanese Patent Application Laid-Open Publication No. 2004-186663 (Patent Document 3) and Japanese Patent Application Laid-Open Publication No. 2001-168219 (Patent Document 4)).

SUMMARY OF THE INVENTION

In the course of the development of the split-gate memory cell using the MONOS method, the inventors of the present invention have found out a phenomenon in which the threshold voltage does not decrease to a predetermined value in the deletion (electrons are left unerased) as the number of times of the information rewriting increases. Due to such a phenomenon, the amount of hole injection required for the deletion is increased, and the deterioration of the bottom insulating film caused by the deleting operation is hastened. Consequently, it leads to limitation in the number of times of the rewriting.

According to the result of a detailed analysis on the phenomenon in which electrons are left unerased, the inventors of the present invention have found out that this phenomenon is caused by the difference between the spatial distribution of written electrons in the charge-holding film and the positions to inject holes in deletion. This phenomenon will be described with reference to FIG. 30. FIG. 30 is an enlarged view of the rectangular region pointed by the arrow in FIG. 28.

The region where hot electrons are generated in the writing is just below a region electrically separating the select gate 32 and the memory gate 31. The electrons injected to the silicon nitride film 33b from this region are preferentially trapped from the injected position. Therefore, distribution of written electrons tends to be localized.

On the other hand, in the deletion, hot holes are injected from an edge of the drain region 36 of the memory MOS transistor in the arrow direction. Though the injected holes are affected by the electric field of the memory gate 31 and diffused slightly toward the select MOS transistor side, the density of trapped holes is rapidly decreased as separated from the injection edge. Therefore, since the spatial distribution is separated from that of written electrons, localized electrons cannot be erased completely, and the phenomenon of electrons left unerased occurs.

According to a further analysis on the reason why the difference occurs in trapping positions between electrons and holes, the inventors of the present invention have found out that the difference is significant particularly in the case where a part of the silicon nitride film 33b as the charge-holding film is located lower than an interface between the gate insulating film 34 of the select MOS transistor and the silicon substrate 1. This is because the injected electrons directly come into the silicon nitride film 33b without being scattered in the bottom oxide film 33a and are localized at a position farthest from that of injected holes.

The positional relation of the silicon nitride film 33b and the surface of silicon substrate 1 in a vertical direction is a problem caused when securing a process margin as follows. Just before a process to form the memory MOS transistor, a process to remove the gate insulating film 34 and the gate electrode material of the select MOS transistor by dry etching is performed. In this dry-etching process, the over-etching is necessary so as to surely perform the removal on the entire surface of the wafer. Therefore, a part of the surface of silicon wafer 1 is concaved. If the bottom oxide film 33a is formed through thermal oxidation in the state where the concave is present, since the oxidation progresses from the surface of the silicon substrate 1 to its inside, it is concaved deeper. Therefore, when the silicon nitride film 33b as the charge-holding film is formed thereafter, a part thereof is located lower than the interface between the gate insulating film 34 of the select MOS transistor and the silicon substrate 1.

An object of the present invention is to provide a technique capable of improving rewrite tolerability of a split-gate memory cell that adopts the MONOS method.

The above and other objects and novel characteristics of the present invention will be apparent from the description of this specification and the accompanying drawings.

The typical ones of the inventions disclosed in this application will be briefly described as follows.

A semiconductor device according to the present invention comprises: a plurality of memory cells arranged in matrix in a first direction of a main surface of a semiconductor substrate of a first conductivity type and a second direction crossing the first direction at right angle, wherein each of the plurality of memory cells includes: a select gate formed on the semiconductor substrate with interposing a first gate insulating film therebetween; a memory gate formed on one sidewall of the select gate and insulated from the select gate and the semiconductor substrate via a second gate insulating film; a source region formed of a semiconductor region of a second conductivity type formed in the semiconductor substrate adjacent to the select gate; and a drain region formed of a semiconductor region of the second conductivity type formed in the semiconductor substrate adjacent to the memory gate, wherein the second gate insulating film is configured to include at least a potential barrier film and a charge-holding film stacked on the potential barrier film, and wherein an interface between the potential barrier film and the charge-holding film in a neighborhood of a bottom part of the select gate is located at a position as high as or higher than that of an interface between the semiconductor substrate and the first gate insulating film.

Also, a method of manufacturing a semiconductor device according to the present invention is a manufacturing method of a semiconductor device which comprises: a plurality of memory cells arranged in matrix in a first direction of a main surface of a semiconductor substrate of a first conductivity type and a second direction crossing the first direction at right angle, wherein each of the plurality of memory cells includes: a select gate formed on the semiconductor substrate with interposing a first gate insulating film therebetween; a memory gate formed on one sidewall of the select gate and insulated from the select gate and the semiconductor substrate via a second gate insulating film; a source region formed of a semiconductor region of a second conductivity type formed in the semiconductor substrate adjacent to the select gate; and a drain region formed of a semiconductor region of the second conductivity type formed in the semiconductor substrate adjacent to the memory gate, wherein the second gate insulating film is configured to include at least a potential barrier film and a charge-holding film stacked on the potential barrier film, wherein a process to form the memory cell includes the steps of: (a) forming the select gate on the semiconductor substrate with interposing the first gate insulating film therebetween; (b) forming the second gate insulating film including at least the potential barrier film and the charge-holding film so as to cover a surface of the semiconductor substrate and a surface of the select gate; (c) forming the memory gate on one sidewall of the select gate by patterning a conductive film formed on the second gate insulating film; (d) leaving the second insulating film between the sidewall of the select gate and the memory gate and between the semiconductor substrate and the memory gate by patterning the second gate insulating film; and (e) forming the source region formed of the semiconductor region of the second conductivity type in the semiconductor substrate adjacent to the select gate and forming the drain region formed of the semiconductor region of the second conductivity type in the semiconductor substrate adjacent to the memory gate by introducing an impurity into the semiconductor substrate, and wherein, in the step (b), the second gate insulating film is formed so that an interface between the potential barrier film and the charge-holding film in a neighborhood of a bottom part of the select gate is located at a position as high as or higher than an interface between the semiconductor substrate and the first gate insulating film.

The effects obtained by typical aspects of the present invention will be briefly described below.

Rewrite tolerability of a memory cell can be improved.

BRIEF DESCRIPTIONS OF THE DRAWINGS

Figure 10:
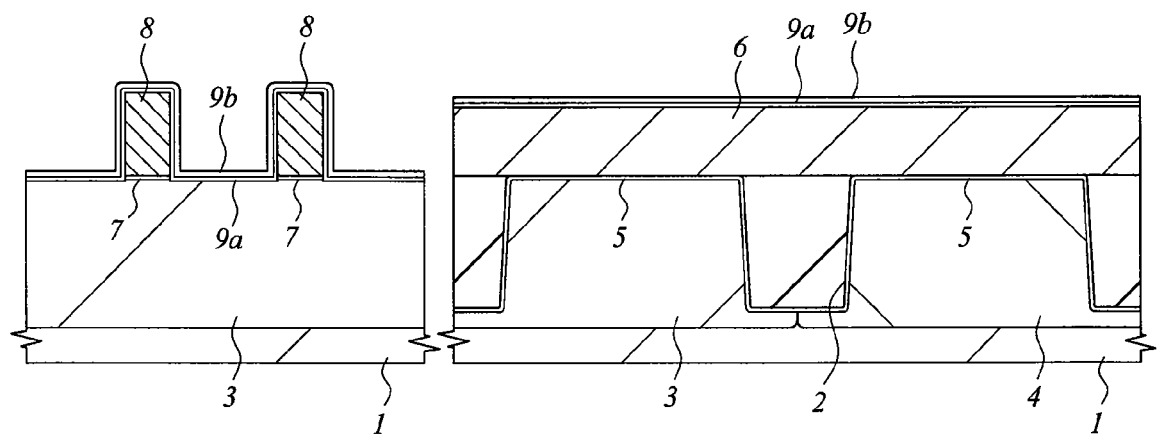
FIG. 10 is a cross-sectional view of main parts showing the method of manufacturing the semiconductor device continued from FIG. 8.
Figure 12:
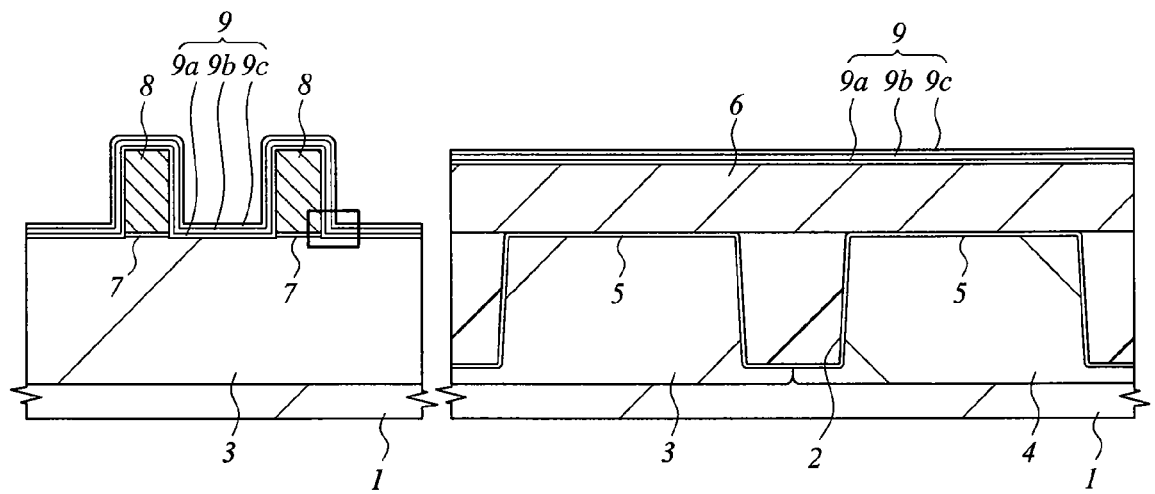
Figure 13:
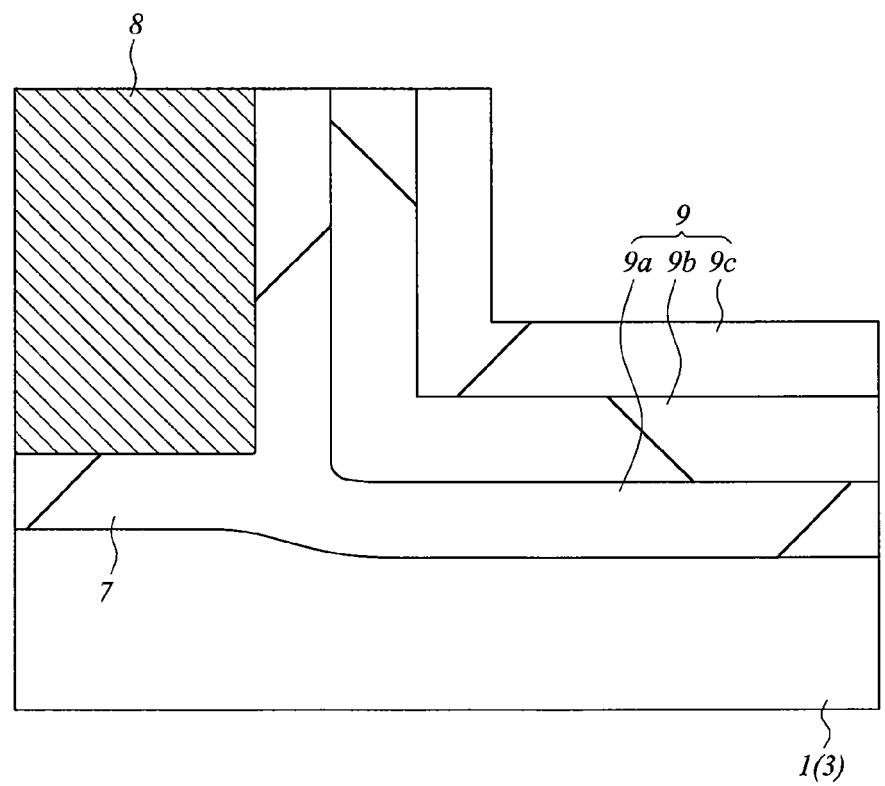
Figure 14:
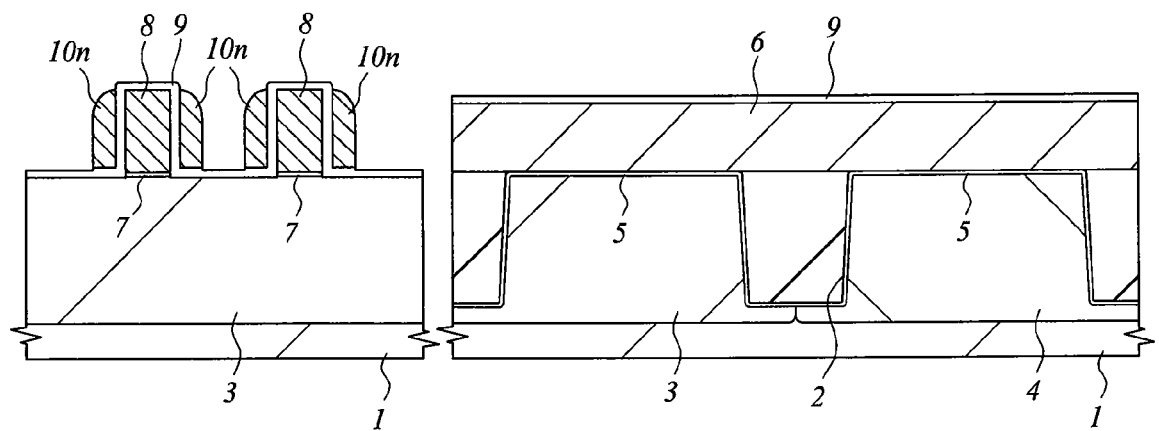
Figure 15:
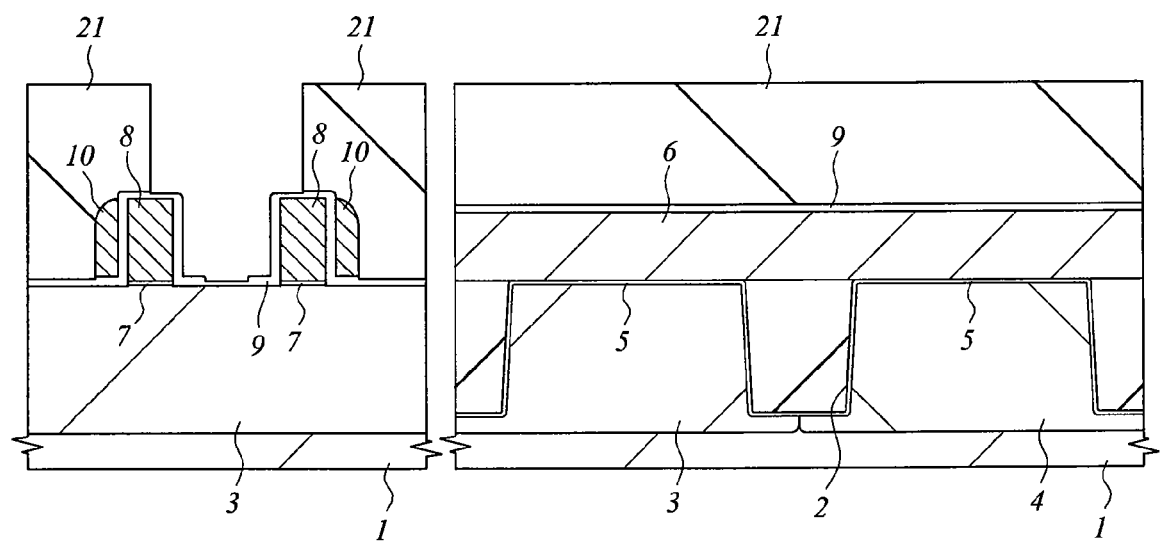
Figure 16:
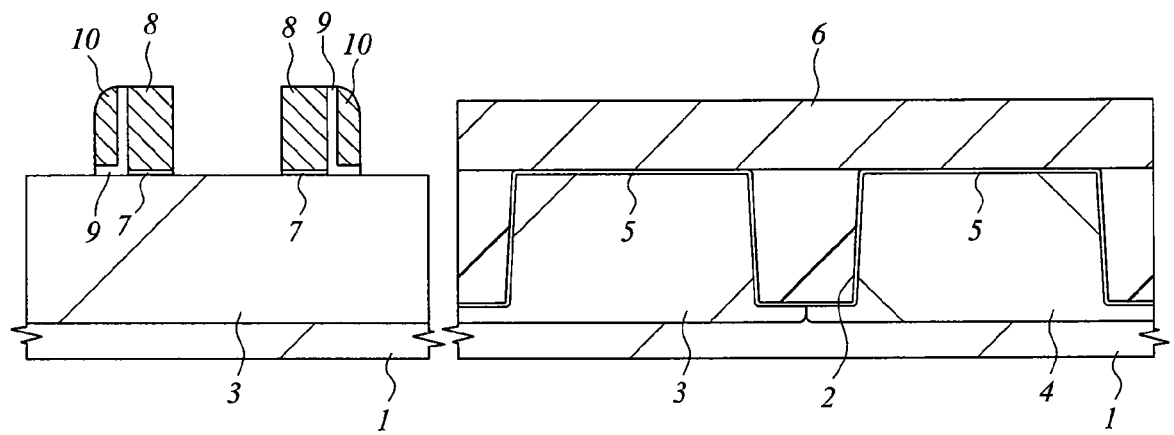
Figure 17:
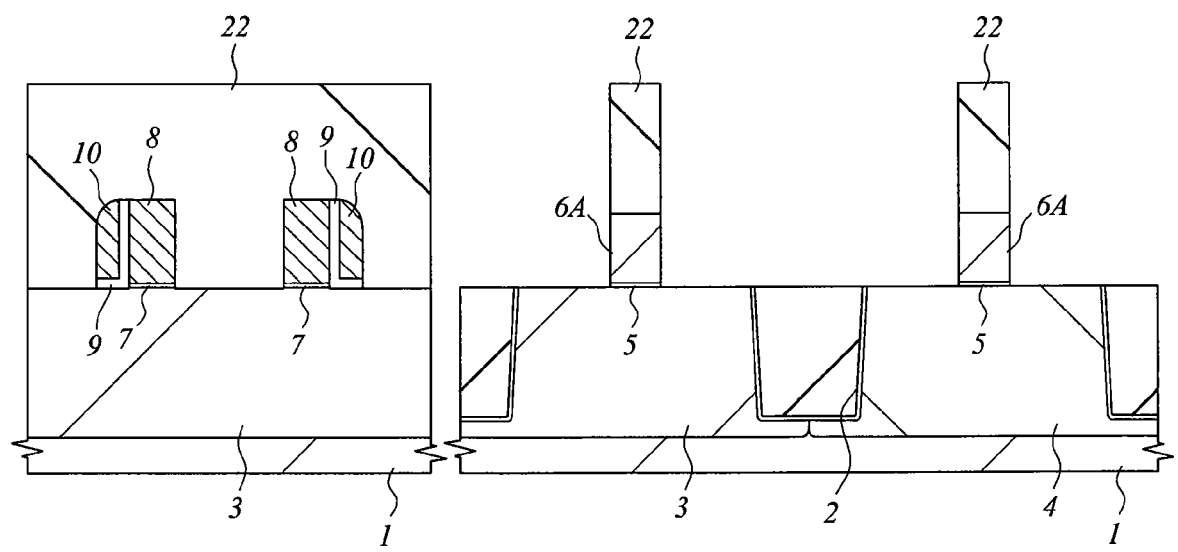
Figure 18:
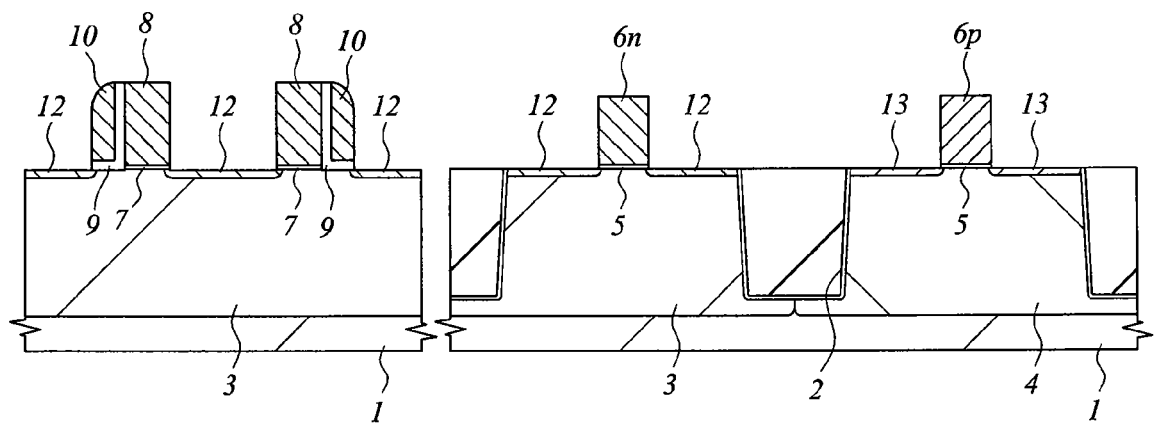
Figure 19:
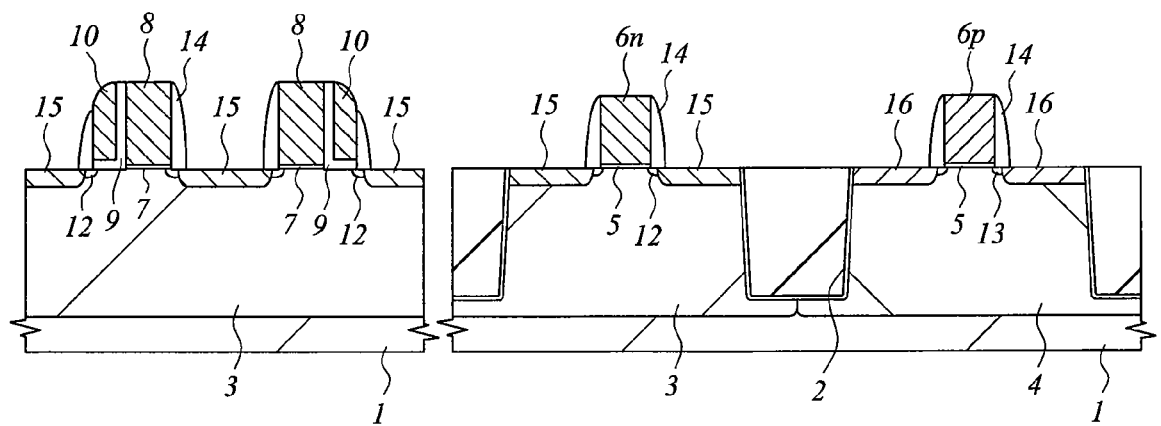
Figure 20:
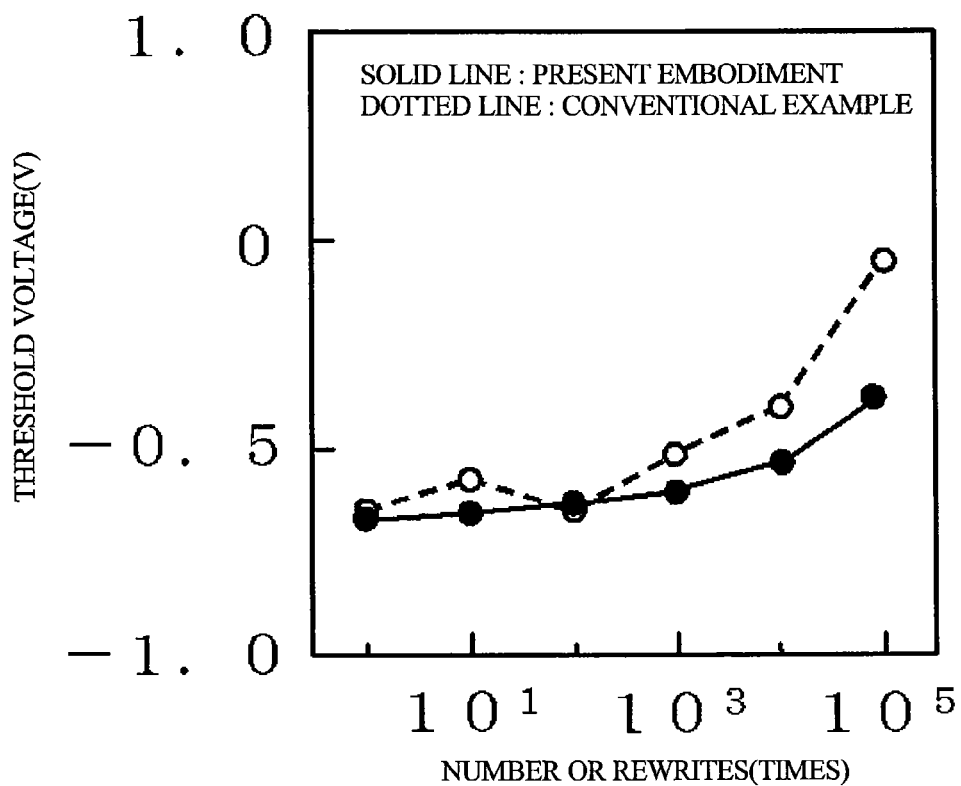
Figure 21:
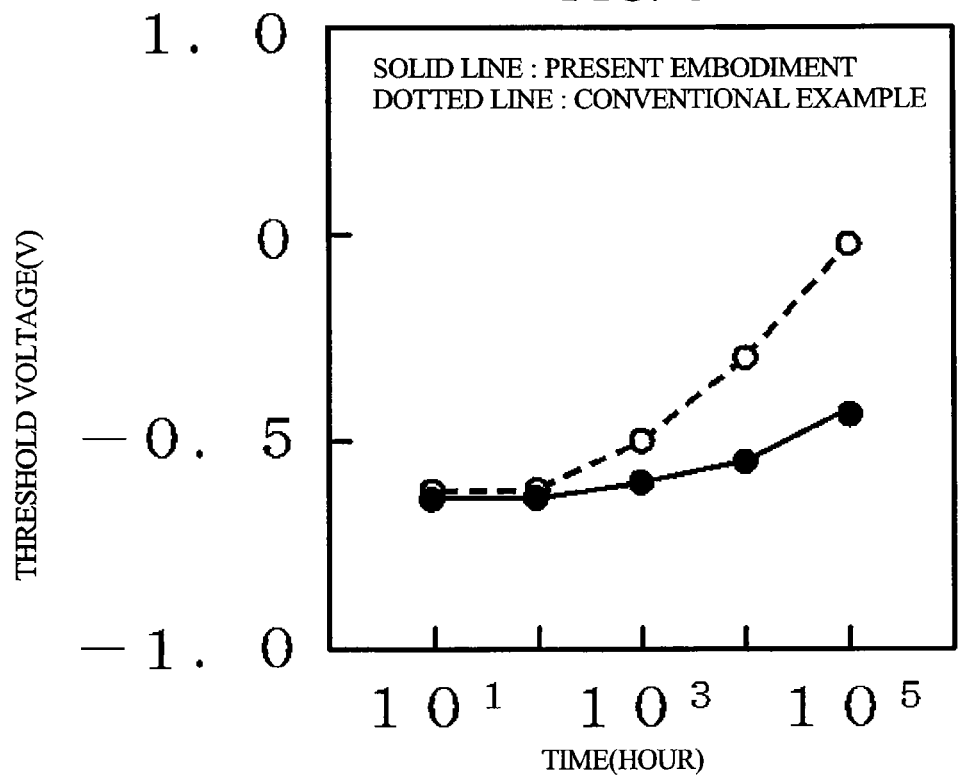
Figure 22:
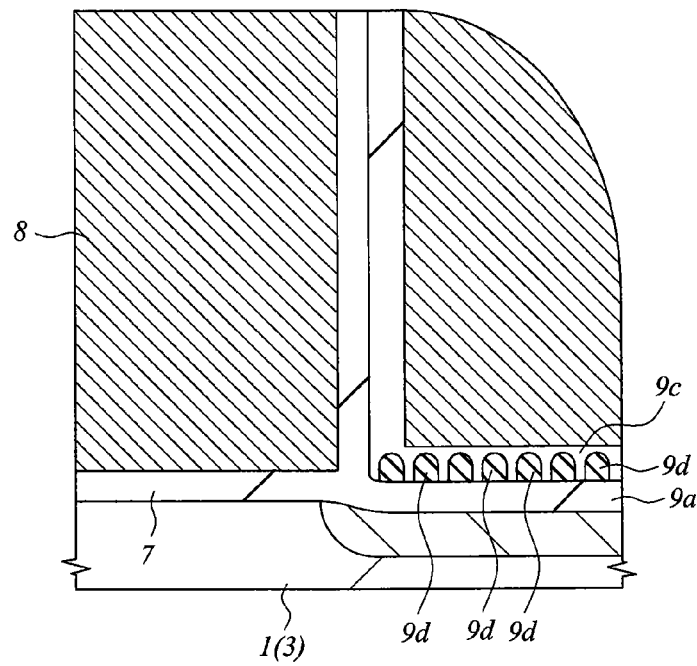
Figure 23:
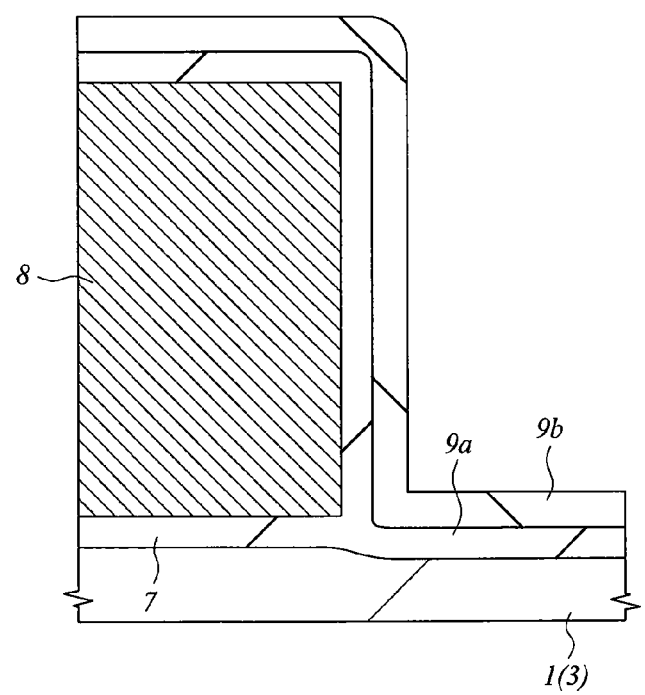
Figure 24:
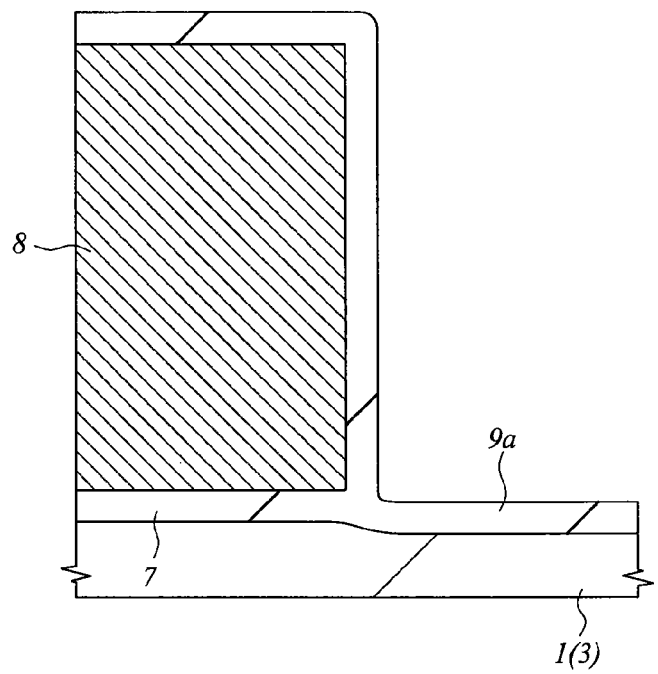
Figure 25:
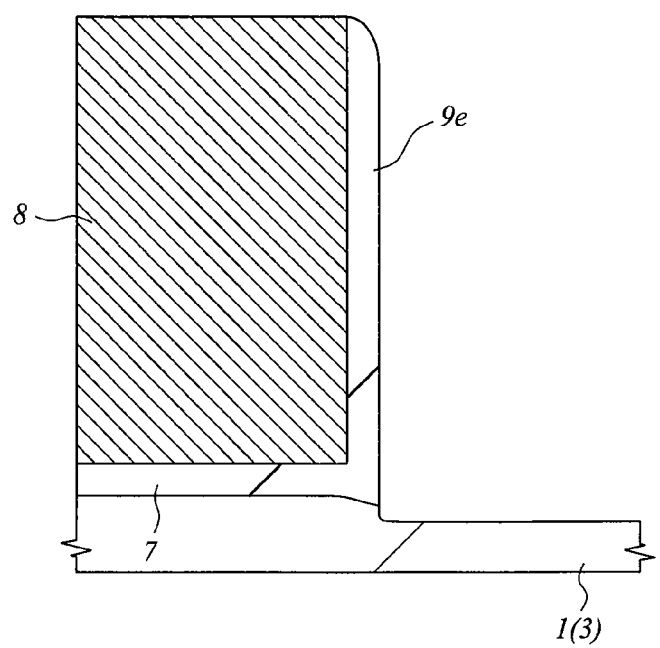
Figure 26:
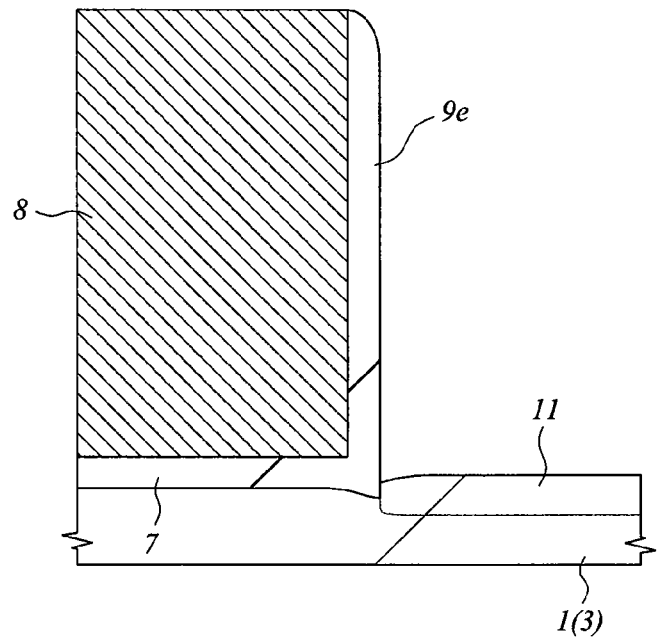
Figure 27:
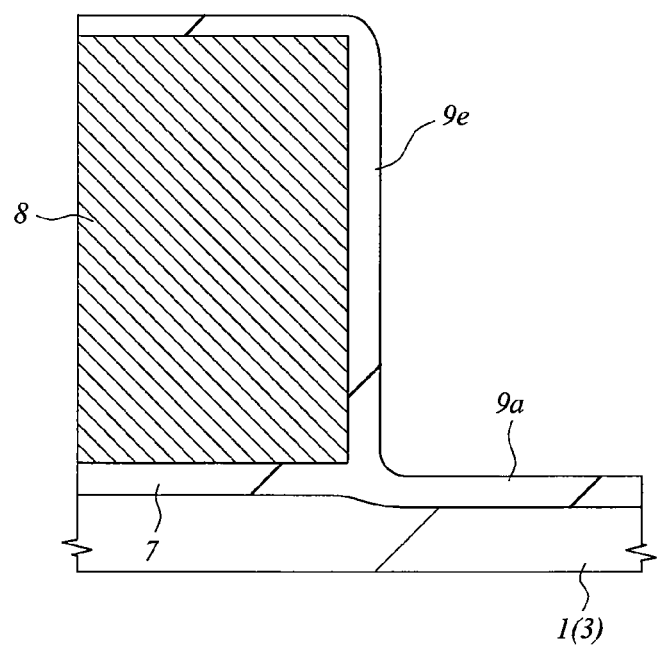
Figure 28:
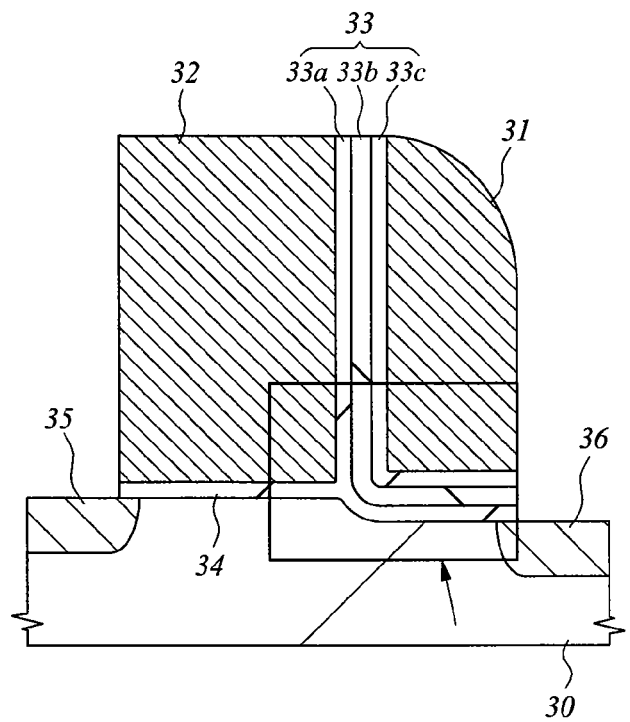
Figure 29:
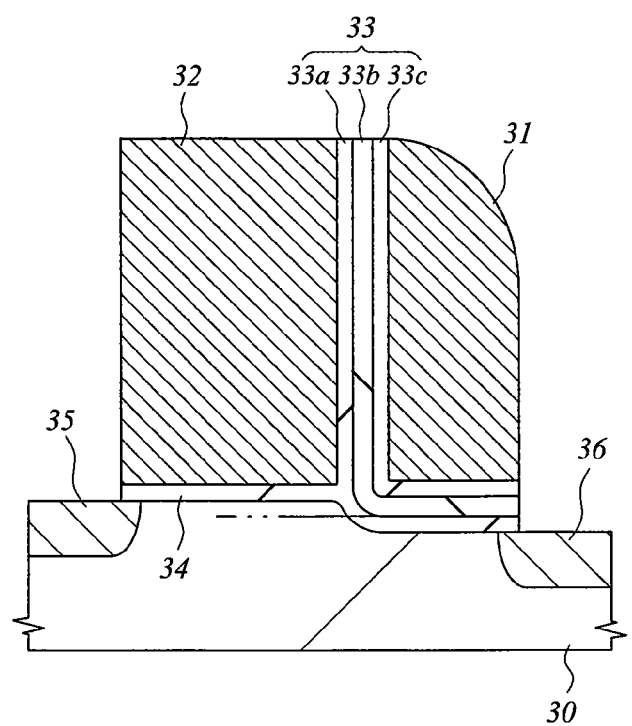
Figure 30:
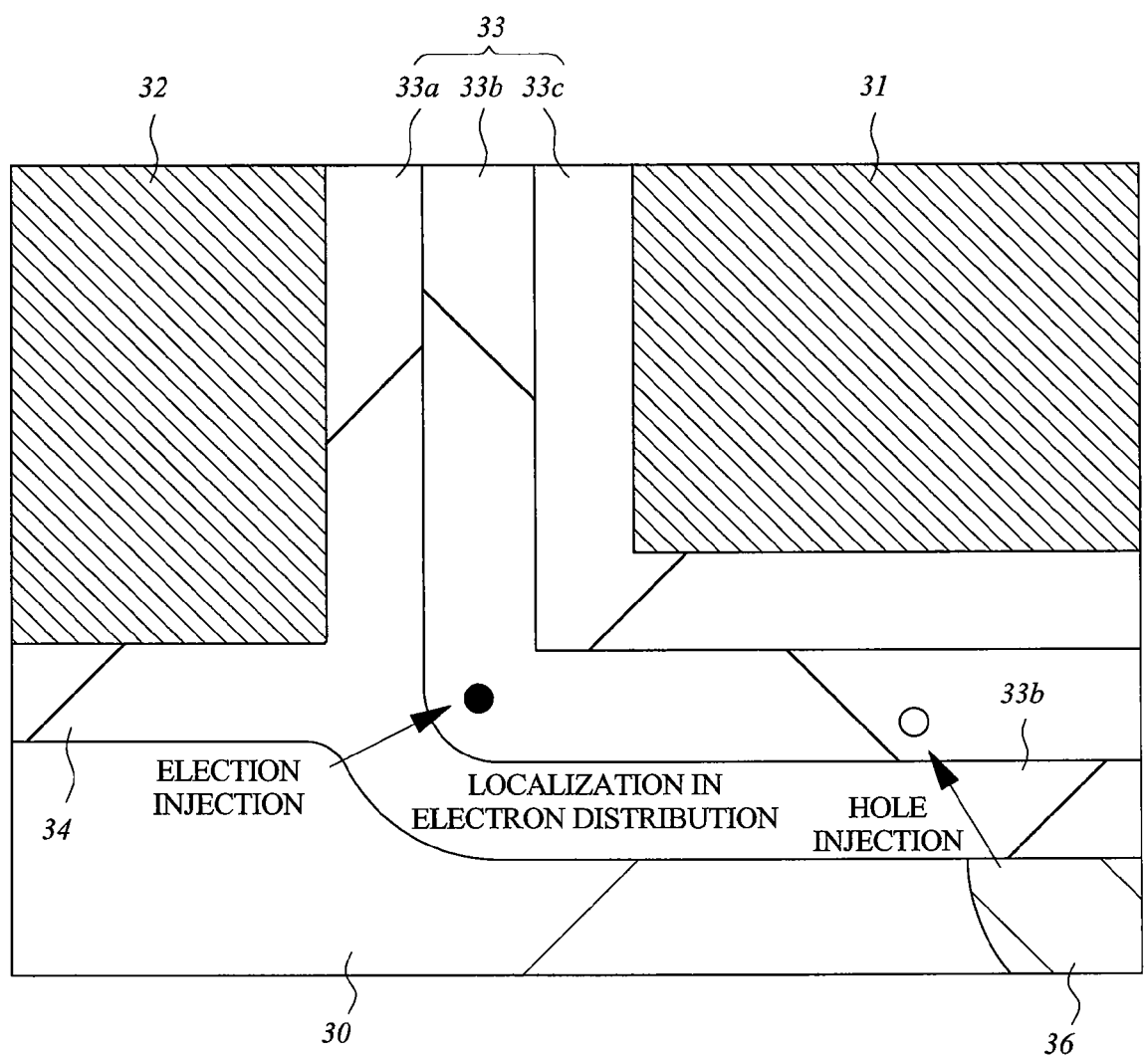

FIG. 12 a cross-sectional view of main parts showing the method of manufacturing the semiconductor device continued from FIG. 10;

FIG. 13 is an enlarged cross-sectional view showing a part of FIG. 10;

FIG. 14 is a cross-sectional view of main parts showing the method of manufacturing the semiconductor device continued from FIG. 12;

FIG. 15 is a cross-sectional view of main parts showing the method of manufacturing the semiconductor device continued from FIG. 14;

FIG. 16 is a cross-sectional view of main parts showing the method of manufacturing the semiconductor device continued from FIG. 15;

FIG. 17 is a cross-sectional view of main parts showing the method of manufacturing the semiconductor device continued from FIG. 16;

FIG. 18 is a cross-sectional view of main parts showing the method of manufacturing the semiconductor device continued from FIG. 17;

FIG. 19 is a cross-sectional view of main parts showing the method of manufacturing the semiconductor device continued from FIG. 18;

FIG. 20 is a graph showing a comparison in rewrite tolerability between the semiconductor device of the embodiment of the present invention and a conventional semiconductor device;

FIG. 21 is a graph showing a comparison in charge-holding characteristic between the semiconductor device of the embodiment of the present invention and a conventional semiconductor device;

FIG. 22 is an enlarged cross-sectional view showing a part of a semiconductor device according to another embodiment of the present invention;

FIG. 23 is a cross-sectional view of main parts showing a method of manufacturing the semiconductor device according to still another embodiment of the present invention;

FIG. 24 is a cross-sectional view of main parts showing a method of manufacturing the semiconductor device according to still another embodiment of the present invention;

FIG. 25 is a cross-sectional view of main parts showing the method of manufacturing the semiconductor device continued from FIG. 24;

FIG. 26 is a cross-sectional view of main parts showing the method of manufacturing the semiconductor device continued from FIG. 25;

FIG. 27 is a cross-sectional view of main parts showing the method of manufacturing the semiconductor device continued from FIG. 26;

FIG. 28 is a cross sectional view showing main parts of a conventional semiconductor device;

FIG. 29 is a cross sectional view showing main parts of the conventional semiconductor device; and FIG. 30 is an enlarged cross-sectional view showing a part of FIG. 28.

DESCRIPTIONS OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof will be omitted.

First Embodiment

Figure 1:
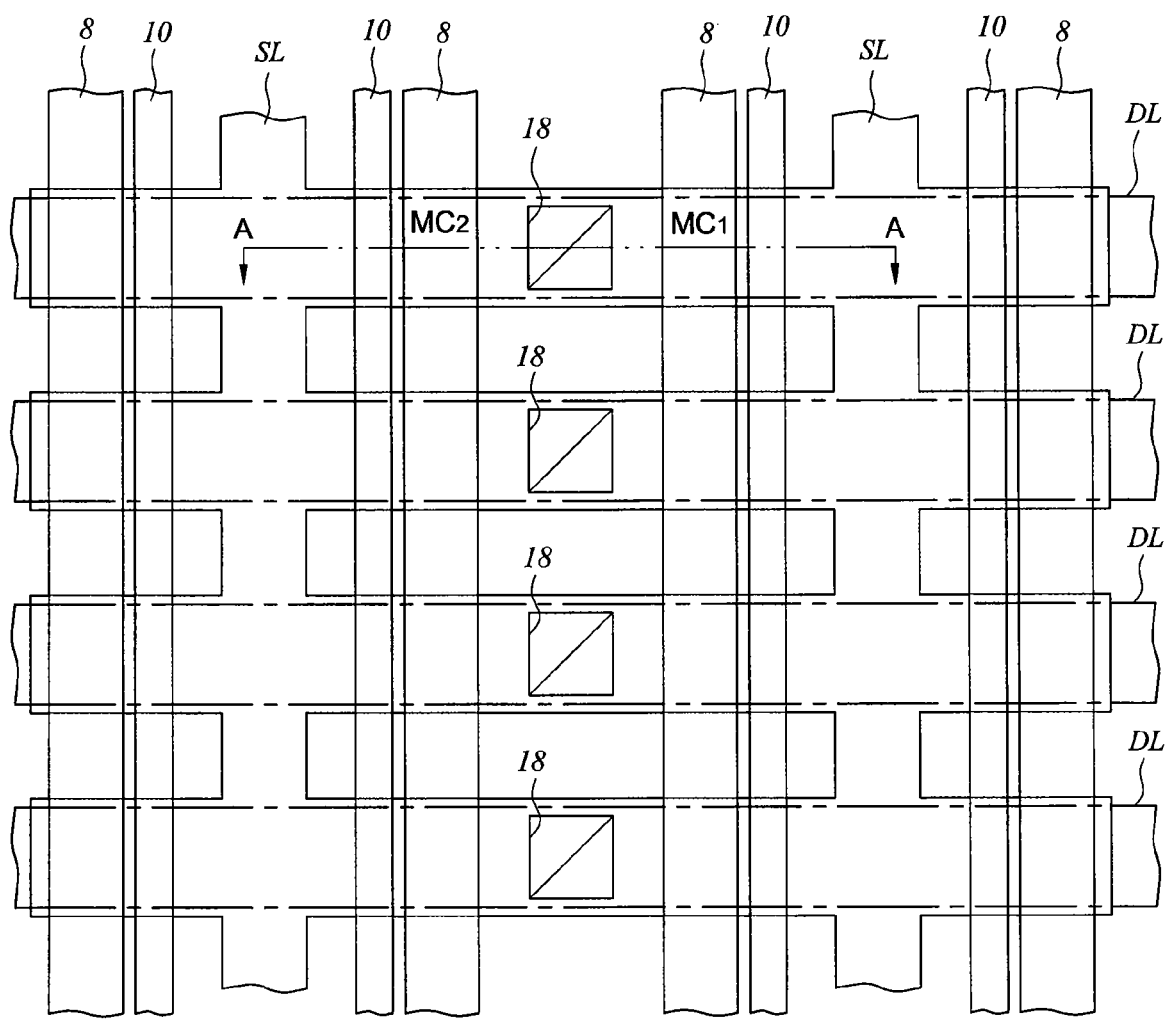
FIG. 1 is a plan view of main parts showing a memory array region of a semiconductor device according to an embodiment of the present invention.
Figure 2:
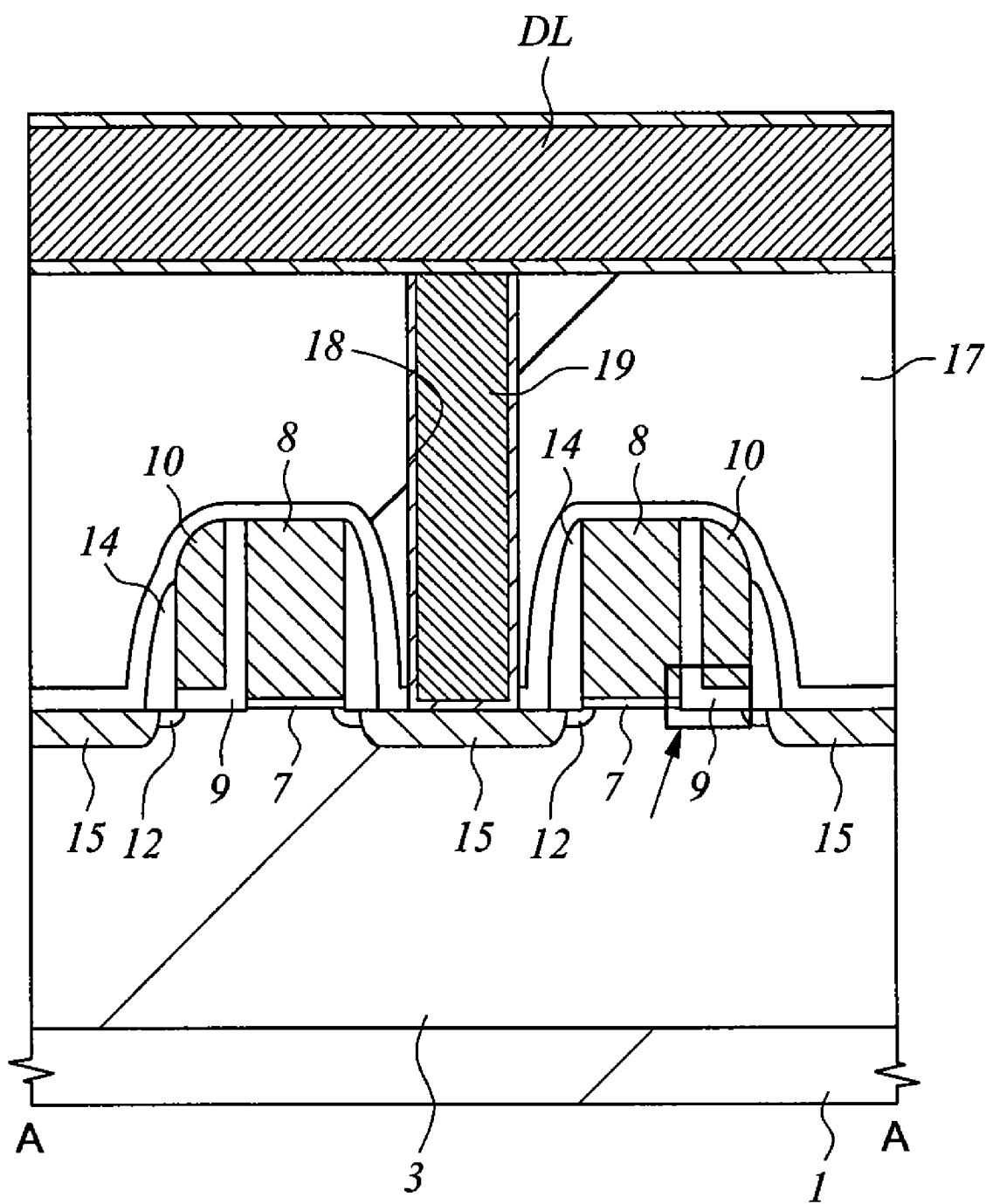
FIG. 2 is a cross-sectional view taken along the line A-A in FIG. 1.
Figure 3:
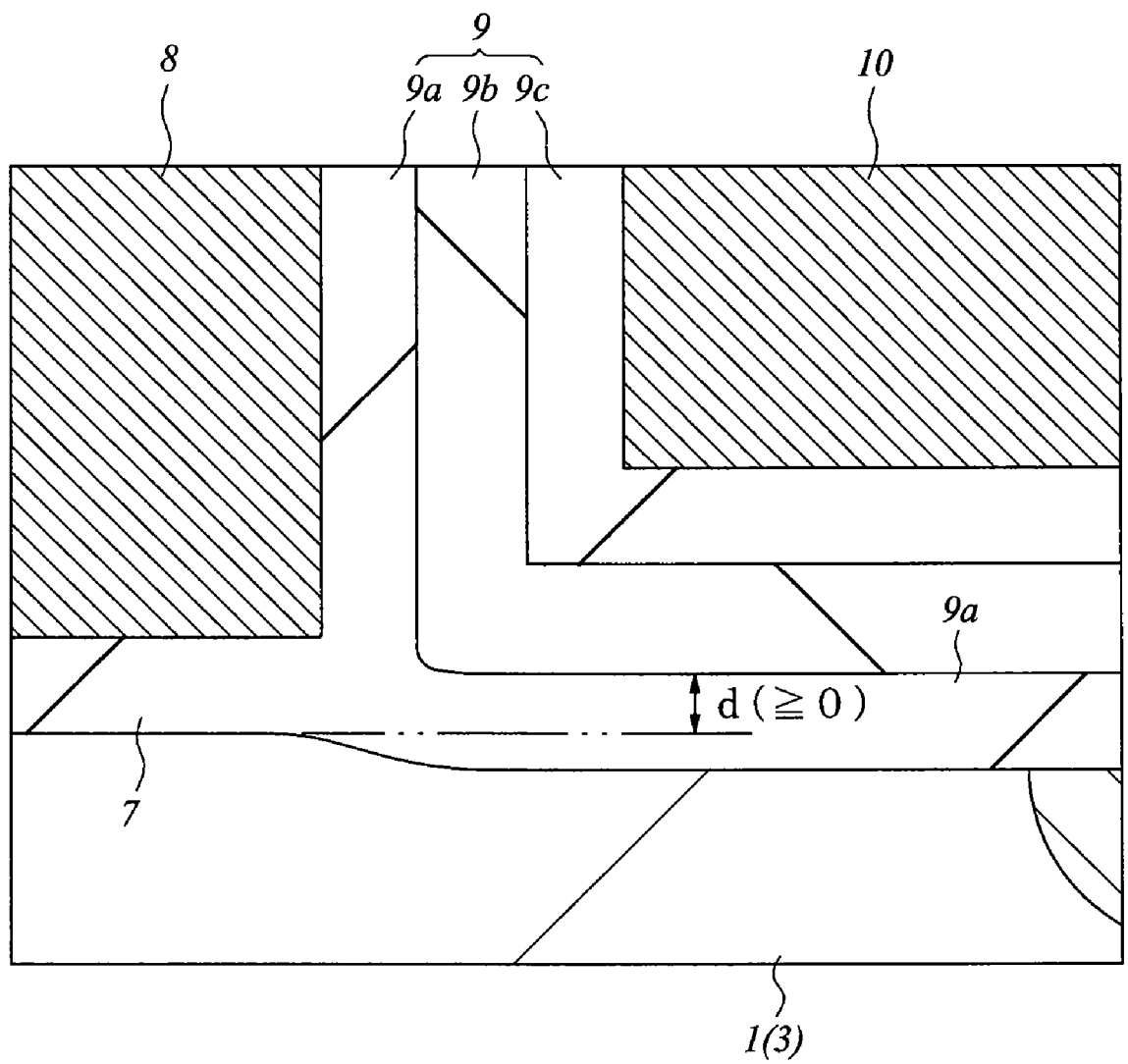
FIG. 3 is an enlarged cross-sectional view showing a part of FIG. 2.

FIG. 1 is a plan view of main parts showing a memory array region of a semiconductor device according to a first embodiment of the present invention, FIG. 2 is a cross-sectional view taken along the line A-A in FIG. 1, and FIG. 3 is an enlarged cross-sectional view of a part (rectangular region pointed by an arrow) in FIG. 2. Note that some of the members in FIG. 1 are not shown in FIG. 1 to make the configuration of memory array region easy to see.

The semiconductor device of the present embodiment includes a non-volatile semiconductor memory having a split-gate memory cell of MONOS method. The split-date memory cell is comprised of a select MOS transistor and a memory MOS transistor formed on a p-type well 3 of a p-type silicon substrate 1 (hereinafter, it is simply referred to as substrate). A gate electrode of the select MOS transistor (select gate 8) is formed of an n-type polycrystalline silicon film and formed on a gate insulating film 7 formed of a silicon oxide film. Also, a gate electrode of the memory MOS transistor (memory gate 10) is formed of an n-type polycrystalline silicon film and located on one of sidewalls of the select gate 8. Although not shown, the select gate 8 is connected to a select gate line, and the memory gate 10 is connected to a word line.

The memory gate 10 is electrically separated from the select gate 8 and the p-type well 3 by a gate insulating film 9 having an L-shaped section, a part of which is formed on one sidewall of the select gate 8 and the other part of which is formed on the p-type well 3. The gate insulating film 9 is formed of a two-layered potential barrier film (bottom oxide film 9a and top oxide film 9c) and a charge-holding film (silicon nitride film 9b) formed therebetween.

An $n^+$-type semiconductor region 15 which functions as a drain region of the memory cell is formed in the p-type well 3 adjacent to the select gate 8. The n+-type semiconductor region 15 (drain region) is connected to a data line (DL). The data line (DL) is formed on an interlayer insulating film 17 covering the memory cell and is electrically connected to the n+-type semiconductor region (drain region) 15 via a plug 19 in a contact hole 18. The data line (DL) is formed of a metal film mainly made of aluminum alloy, and the plug 19 is formed of a metal film mainly made of tungsten. On the other hand, an n+-type semiconductor region 15 which functions as a source region of the memory cell is formed in the p-type well 3 adjacent to the memory gate 10. The n+-type semiconductor region (source region) 15 is connected to a common source line (SL).

An n−-type semiconductor region 12 having an impurity concentration lower than that of the n+-type semiconductor region 15 is formed in a region of the p-type well 3 adjacent to the n+-type semiconductor region (drain region) 15. The n−-type semiconductor region 12 is an extension region to mitigate a high electric field at an edge of the n+-type semiconductor region (drain region) 15 and to form an LDD (Light Doped Drain) structure for the select MOS transistor. Further, the n−-type semiconductor region 12 having an impurity concentration lower than that of the n+-type semiconductor region 15 is formed in a region of the p-type well 3 adjacent to the n+-type semiconductor region (source region) 15. The n−-type semiconductor region 12 is an extension region to mitigate a high electric field at an edge of the n+-type semiconductor region (source region) 15 and to form an LDD structure for the memory MOS transistor. Sidewall spacers 14 formed of a silicon oxide film are formed on the other sidewall of the select gate 8 and one sidewall of the memory gate 10. These sidewall spacers 14 are used to form the n+-type semiconductor region (drain region) 15 and the n+-type semiconductor region (source region) 15.

FIG. 3 is an enlarged sectional view showing a neighborhood of a bottom part of the select gate 8 (rectangular region pointed by an arrow in FIG. 2). As shown in FIG. 3, an interface between the bottom oxide film 9a and the silicon nitride film 9b in the neighborhood of the bottom part of select gate 8 is located at a position as high as or higher than that of an interface between the substrate 1 (p-type well 3) and the gate insulating film 7 ($d \geq 0$). Further, the gate insulating film 7 and the bottom oxide film 9a are successively and smoothly jointed in the neighborhood of the bottom part of the select gate 8.

The configuration described above mitigates the localization in electron distribution of electrons injected to the silicon nitride film 9b in the writing, and the electrons left unerased by the hot-hole erasing are reduced. Therefore, not only the increase ratio of the amount of electrons left unerased in the writing can be reduced, but also the problem in which the threshold voltage does not decrease to the predetermined voltage in the deletion can be suppressed. As a result, rewrite tolerability of the memory cell can be improved.

Next, a method of manufacturing the non-volatile semiconductor memory device described above is described in the order of processes with reference to FIG. 4 to FIG. 19. Note that, in each figure to describe the manufacturing method, the left side is a sectional view showing a part of the memory array region (the region taken along the line A-A in FIG. 1) and the right side is a sectional view showing a part of a peripheral circuit region. In the peripheral circuit region of the non-volatile semiconductor memory device, circuits comprised of low-withstand-voltage MOS transistors such as a sense amplifier, a column decoder, and a row decoder and circuits comprised of high-withstand-voltage MOS transistors such as a booster circuit are to be provided. However, only a method of manufacturing a memory cell and a low-withstand-voltage MOS transistor is described herein.

Figure 4:
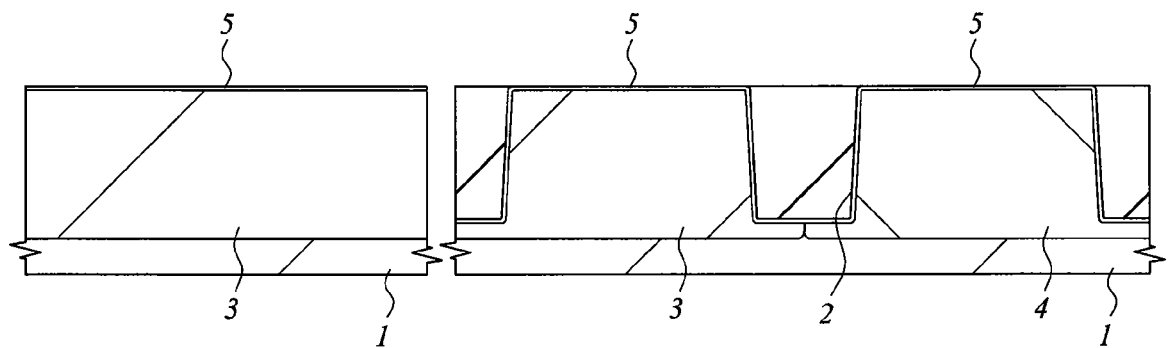
FIG. 4 is a cross-sectional view of main parts showing a method of manufacturing the semiconductor device according to an embodiment of the present invention.

First, as shown in FIG. 4, device isolation trenches 2 are formed in the main surface of the substrate 1 by using well-known manufacturing technique, and then the p-type well 3 and an n-type well 4 are formed in the main surface of the substrate 1. Next, the substrate 1 is subjected to thermal oxidation to form the gate insulating film 5 made of silicon oxide having a thickness of about 3 to 4 nm on respective surfaces of the p-type well 3 and the n-type well 4. The gate insulating film 5 forms the gate insulating films of the MOS transistors configuring the peripheral circuits.

Figure 5:
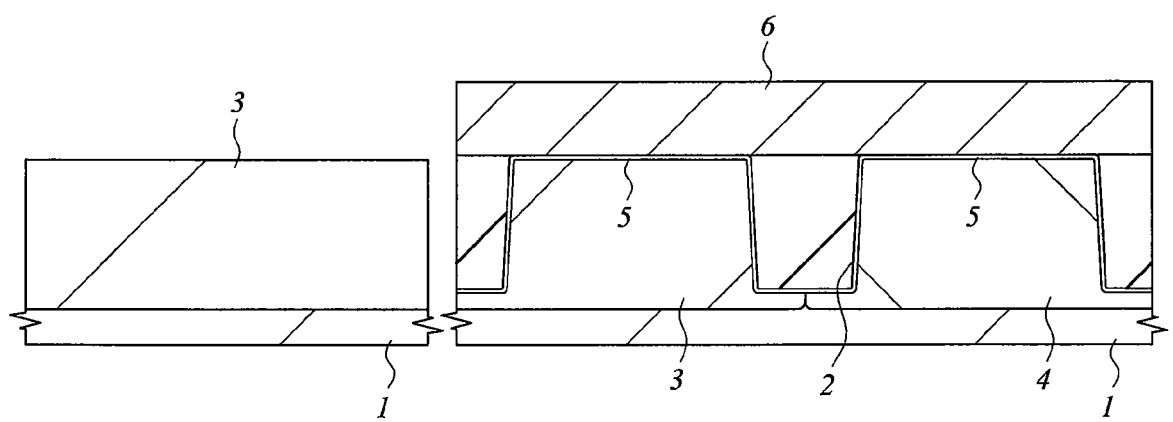
FIG. 5 is a cross-sectional view of main parts showing the method of manufacturing the semiconductor device continued from FIG. 4.

Next, as shown in FIG. 5, an undoped polycrystalline silicon film 6 having a thickness of about 150 nm is deposited on the substrate 1 by CVD method. Then, the undoped polycrystalline silicon film 6 in the memory array region is removed through dry-etching using a photoresist film as a mask. The undoped polycrystalline silicon film 6 forms the gate electrodes of the MOS transistors of the peripheral circuits. Subsequently, after a p-type impurity (boron) is implanted into the p-type well 3 of the memory cell array so as to adjust threshold voltage of the select MOS transistor, the gate insulating film 5 in the memory array region is removed by using diluted hydrofluoric acid solution.

Figure 6:
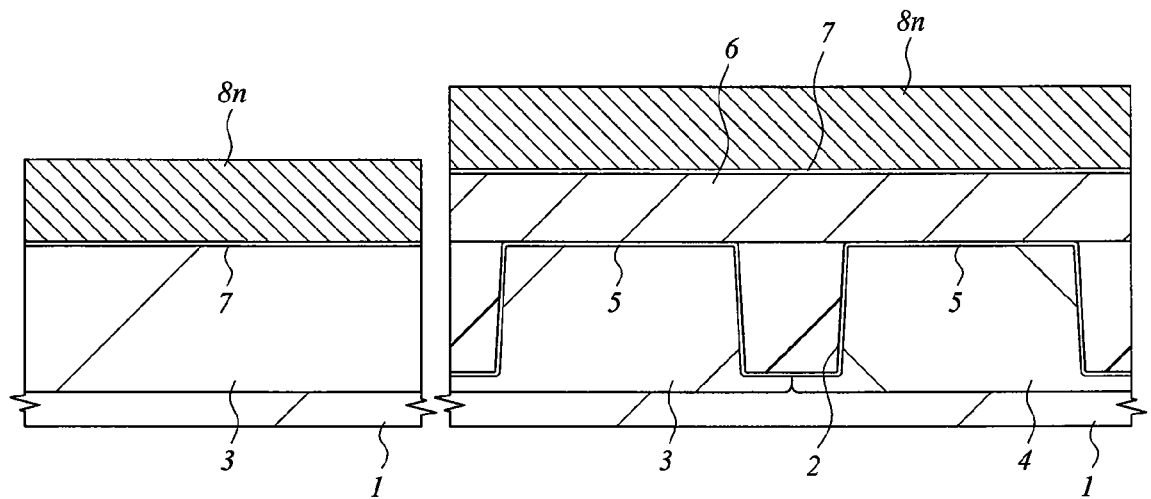
FIG. 6 is a cross-sectional view of main parts showing the method of manufacturing the semiconductor device continued from FIG. 5.

Next, as shown in FIG. 6, the substrate 1 is subjected to thermal oxidation to form the gate insulating film 7 made of silicon oxide having a thickness of about 3 to 4 nm on a surface of the p-type well 3 in the memory array region. The insulating film 7 forms a gate insulating film of the select MOS transistor. Subsequently, a polycrystalline silicon film 8n having a thickness of about 200 nm is deposited on the substrate 1 by CVD method. Phosphorus of about $4 \times 10^{20}$ atom/cm$^3$ is introduced into the polycrystalline silicon film 8b during the deposition thereof to make its conductivity type to an n-type.

Figure 7:
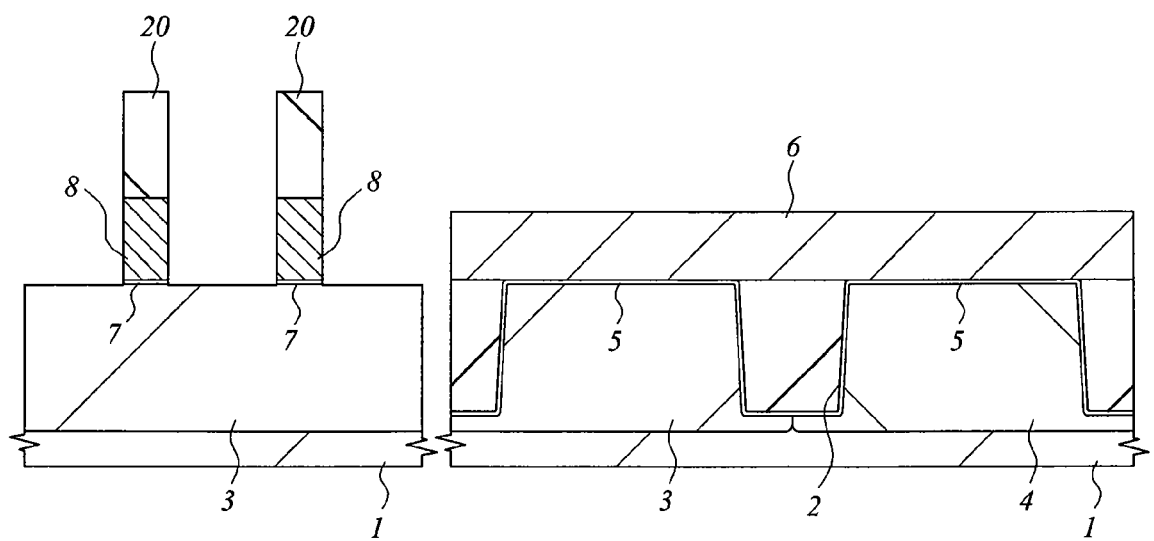
FIG. 7 is a cross-sectional view of main parts showing the method of manufacturing the semiconductor device continued from FIG. 6.

Next, as shown in FIG. 7, the polycrystalline silicon film 8n in the memory array region is patterned through dry etching using a photoresist film 20 as a mask to form the select gate 8. At this time, whole of the polycrystalline silicon film 8n in the peripheral circuit region is removed. Subsequently, as the substrate cleaning, a surface of the substrate (p-type well 3) is isotropically dry-etched to remove the damages on the surface of the substrate 1 (p-type well 3) caused by the dry etching of the polycrystalline silicon film 8n.

At the time when the polycrystalline silicon film 8n and the gate insulating film 7 in the memory array region are dry-etched, the amount of overetching of the substrate 1 is suppressed to about 1 to 3 nm. Further, also when the surface of the substrate 1 is isotropically dry-etched, the amount of overetching of the substrate 1 is suppressed to about 1 to 3 nm. By this means, it is possible to suppress the damage on the substrate 1 due to dry etching to minimum and prevent the polycrystalline silicon film 8b from being left unetched. Accordingly, the reduction in yield can be prevented.

Normally, in a process to form gate electrodes through dry etching of a polycrystalline silicon film, light thermal oxidation such as ISSG (In-situ Steam Generation) oxidation is implemented in order to remove the defects in the gate insulating film in an edge of the gate electrode. On the other hand, in the present embodiment, since defects in the gate insulating film 7 are reduced by suppressing the amount of overetching to about 1 to 3 nm, the light oxidation process after the gate processing can be omitted. As a result, the height difference between the surface of the substrate 1 (p-type well 3) exposed by the overetching and the bottom surface of the select gate 8

(polycrystalline silicon film 8n) can be made to be extremely small, and therefore, the ON-current of the memory cell can be increased.

Alternatively, in the process of forming the select gate 8 by the dry etching of the polycrystalline silicon film 8n, about 1 to 5 nm of the polycrystalline silicon film 8b is left, and then the isotropic dry etching for both the removal of the unetched polycrystalline silicon film 8b and the cleaning of the substrate 1 may be implemented. By suppressing the etched amount of the substrate 1 to 1 to 6 nm in this order of processes, both of the suppression of yield reduction and the removal of damages by the dry etching can be achieved at the same time.

Figure 8:
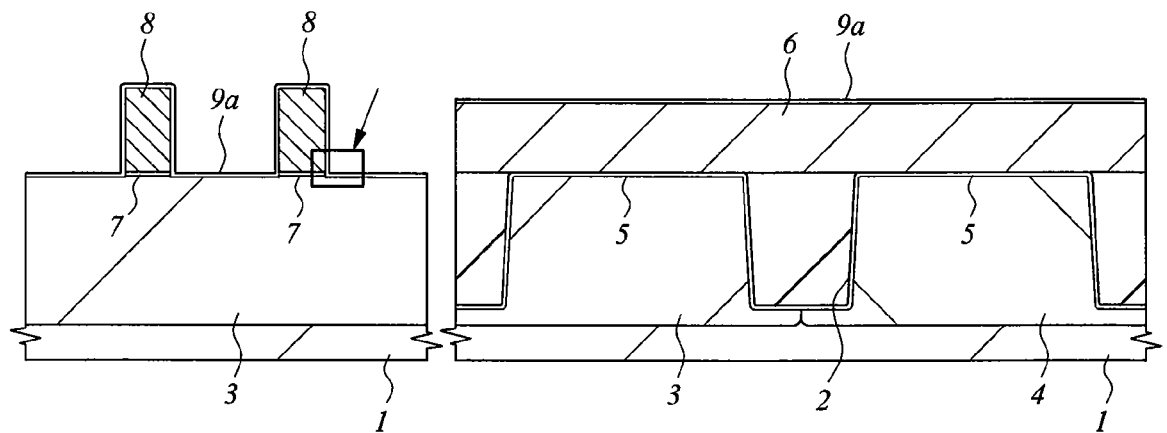
FIG. 8 is a cross-sectional view of main parts showing the method of manufacturing the semiconductor device continued from FIG. 7.

Next, as shown in FIG. 8, the bottom oxide film 9a to be a part of the gate insulating film 9 is formed. The bottom oxide film 9a is formed by using both of the thermal oxidation and the CVD method, and it has a thickness of about 2 to 7 nm. As the thermal oxidation, for example, ISSG oxidation, dry oxidation, wet oxidation, and plasma oxidation can be used. As the CVD method, for example, normal-pressure CVD, low-pressure CVD, and plasma CVD can be used. Further, instead of CVD method, ALD (Atomic Layer Deposition) method can be used. Still further, by performing the annealing in an atmosphere containing nitrogen, hydrogen, deuterium and the like or in vacuum in the midst of forming the bottom oxide film 9a or after the bottom oxide film 9a is formed, the reliability of the bottom oxide film 9a can be improved.

Figure 9:
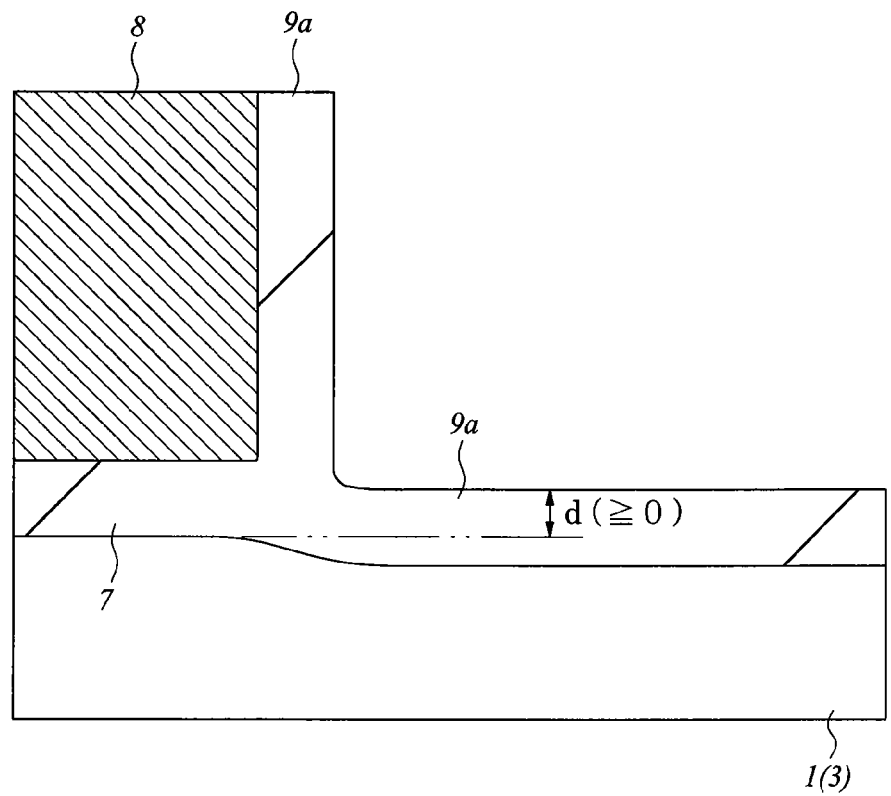
FIG. 9 is an enlarged cross-sectional view showing a part of the FIG. 8.

FIG. 9 is an enlarged cross-sectional view showing a neighborhood of a bottom part of the select gate 8 (rectangular region pointed by an arrow in FIG. 8). As described above, when forming the select gate 8 by the dry etching of the polycrystalline silicon film 8n, the amount of overetching of the substrate 1 is suppressed, and the height difference between the surface of the substrate 1 and the bottom surface of the select gate 8 is made extremely small in the present embodiment. Accordingly, when the bottom oxide film 9a is formed on the surface of the substrate 1 and the surface of the select gate 8, the interface between the bottom oxide film 9a and the silicon nitride film 9b in the neighborhood of the bottom part of the select gate 8 is located at a position as high as or higher than that of the interface between the substrate 1 (p-type well 3) and the gate insulating film 7 (d≧0). Further, the gate insulating film 7 and the bottom oxide film 9a are successively and smoothly jointed in the neighborhood of the bottom part of the select gate 8.

Figure 11:
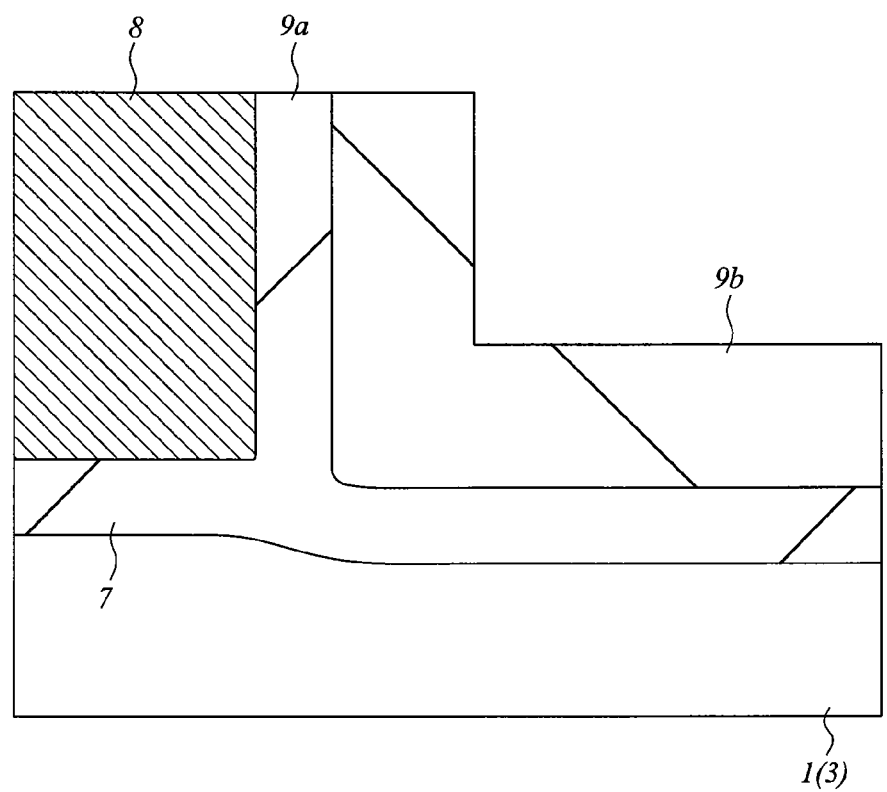
FIG. 11 is an enlarged cross-sectional view showing a part of FIG. 10.

Next, as shown in FIG. 10 and FIG. 11, the silicon nitride film 9b to be a part of the gate insulating film 9 (charge-holding film) is formed on the bottom oxide film 9a. The silicon nitride film 9b is formed through thermal CVD at about 800° C. using dichlorosilane ($SiH_2Cl_2$) and ammonium ($NH_3$) as source material, and it has a thickness of about 13 to 15 nm. The thickness of the silicon nitride film 9b is determined arbitrarily in accordance with the demands for the reduction of operational voltage and improvement of charge-holding characteristics.

Alternatively, after the bottom oxide film 9a is formed, prior to forming the silicon nitride film 9b, the bottom oxide film 9a may be nitrided in a high-temperature atmosphere containing oxynitride such as $N_2O$ to segregate nitrogen on the interface between the bottom oxide film 9a and the substrate 1 (p-type well 3). By this nitridation process, hot-carrier tolerability of the select MOS transistor and the memory MOS transistor configuring the memory cell is improved, and therefore, the characteristics of the memory cell (such as rewrite characteristic) can be improved.

Next, as shown in FIG. 12 and FIG. 13, the top oxide film 9c to be a part of the gate insulating film 9 is formed on the silicon nitride film 9b. The top oxide film 9c is formed by using ISSG oxidation method to oxidize a part of the silicon nitride film 9b, and it has a thickness of about 4 to 6 nm. The top oxide film 9c can be formed also by dry oxidation, wet oxidation, plasma oxidation and the like instead of ISSG oxidation. Further, the top oxide film 9c can be formed by depositing a silicon oxide film through CVD. Note that, it is needless to say that the present invention cab be applied to the case where the gate insulating film 9 is comprised of the bottom oxide film 9a and the silicon nitride film 9b without forming the top oxide film 9c.

Next, the memory gate 10 is formed on one sidewall of the select gate 8. When forming the memory gate 10, as shown in FIG. 14, a polycrystalline silicon film 10n deposited by CVD method on the substrate 1 is anisotropically etched so as to leave the polycrystalline silicon film 10n on both sidewalls of the select gate 8. Phosphorus of about $4 \times 10^{20}$ atom/cm$^3$ is introduced into the polycrystalline silicon film 10n during the deposition thereof to make its conductivity type to an n-type. A channel length of the memory MOS transistor is determined according to the thickness of the polycrystalline silicon film 10n. In the present embodiment, since the thickness of the polycrystalline silicon film 10n is designed about 60 nm, the channel length of the memory MOS transistor is about 60 nm.

Next, as shown in FIG. 15, the memory gate 10 formed of the n-type polycrystalline silicon film 10n is formed on one sidewall of the select gate 8 by etching the n-type polycrystalline silicon film 10n on the other sidewall of the select gate 8 with using a photoresist film 21 as a mask. Next, as shown in FIG. 16, the three-layered insulating film configuring the gate insulating film 9 is etched by using hydrofluoric acid and phosphoric acid. As a result, the gate insulating film 9 is left only in the region covered with the memory gate 10 (one sidewall of the select gate 8 and lower part of the memory gate 10), and the gate insulating film 9 in the other region is removed.

Next, as shown in FIG. 17, after an undoped polycrystalline silicon film 6A in the peripheral circuit region is patterned by the dry etching using a photoresist film 22 as a mask, the gate insulating film 5 is etched using diluted hydrofluoric acid solution to leave the gate insulating film 5 only below the undoped polycrystalline silicon film 6A.

Next, as shown in FIG. 18, phosphorus is ion-implanted into the p-type well 3 in the memory array region and the p-type well 3 in the peripheral circuit region to form the n$^-$-type semiconductor regions 12 in the p-type well 3 in the memory array region and the p-type well 3 in the peripheral circuit region. Further, a gate electrode 6n is formed on the p-type well 3 in the peripheral circuit region. Still further, boron is ion-implanted into the n-type well 4 to form p$^-$-type semiconductor regions 13 and a gate electrode 6p.

Next, as shown in FIG. 19, the sidewall spacers 14 are respectively formed on one sidewalls of the select gate 8 and the memory gate 10 formed in the memory array region, and the sidewall spacers 14 are formed on both sidewalls of the gate electrodes 6n and 6p in the peripheral circuit region. The sidewall spacers 14 are formed by anisotropically etching a silicon oxide film deposited on the substrate 1 through CVD. Subsequently, phosphorus is ion-implanted into the p-type well 3 in the memory array region and the p-type well 3 in the peripheral circuit region, and boron is ion-implanted into the n-type well 4. Thereafter, the substrate 1 is subjected to thermal treatment to diffuse the impurities, thereby forming the n$^+$-type semiconductor regions (source and drain regions) 15 and the p$^+$-type semiconductor regions (source and drain regions) 16. Through the processes described above, a split-gate memory cell of MONOS method is formed in the memory array region, and an n-channel MOS transistor and a p-channel MOS transistor are formed in the peripheral circuit region.

Thereafter, the interlayer insulating film 17 formed of a stacked layer of a silicon nitride film and a silicon oxide film is deposited on the substrate 1, and then the contact hole 18 is formed in the interlayer insulating film 17. Subsequently, after the plug 19 is embedded in the contact hole 18, the data line DL is formed on the interlayer insulating film 17. In this manner, the non-volatile semiconductor memory device shown in FIG. 1 to FIG. 3 described above is completed.

As described above, in the split gate memory cell of the present embodiment, the interface between the bottom oxide film 9a and the silicon nitride film 9b in the neighborhood of the bottom part of the select gate 8 is located at a position as high as or higher than that of the interface between the substrate 1 (p-type well 3) and the gate insulating film 7. Further, the gate insulating film 7 and the bottom oxide film 9a are successively and smoothly jointed in the neighborhood of the bottom part of the select gate 8.

In the configuration described above, the localization in electron distribution can be mitigated when information is written by injecting electrons into the charge-holding film 9b. Therefore, the rewrite tolerability of the memory cell can be improved. FIG. 20 is a graph showing a comparison between the rewrite tolerability of the split-gate memory cell of the present embodiment and that of a conventional split-gate memory cell (i.e., memory cell in which the interface between the bottom oxide film and the silicon nitride film in the neighborhood of the bottom part of the select gate is located at a position lower than the interface between the substrate and the gate insulating film). According to the comparison in variation of threshold values at the time when the number of times of the rewriting is $10^5$, an improvement of about 0.3 V is observed in the present invention.

Further, the mitigation of localization in electron distribution leads to the mitigation of the localization in hole distribution and also the mitigation of the positive electric field to the substrate 1. Therefore, the frequency of the electrons to be pulled into the silicon nitride film 9b due to the positive electric field is decreased, and the phenomenon in which the threshold voltage increases with the passage of time (decrease of charge-holding characteristic) can be suppressed. FIG. 21 is a graph showing a comparison between the charge-holding characteristic of the split-gate memory cell of the present embodiment and that of the conventional split-gate memory cell (i.e., memory cell in which the interface between the bottom oxide film and the silicon nitride film in the neighborhood of the bottom part of the select gate is located at a position lower than the interface between the substrate and the gate insulating film). According to the comparison, the charge-holding characteristic is improved after 100 or more hours in the present embodiment. The effect of suppressing deterioration of the bottom oxide film 9a obtained by the time reduction of the hot-hole erasing probably contributes to this characteristic improvement.

Although the silicon nitride film 9b is used as the charge-holding film in the present embodiment, the charge-holding film can be comprised of a film of oxides or silicon oxides of, for example, tantalum, titanium, zirconium, hafnium, lanthanum, aluminum and the like. These metal oxides and metal silicates can be formed by using vapor-phase deposition method, atomic layer deposition method or the like. By configuring the charge-holding film from these metal oxides or metal silicates which have dielectric constants higher than that of silicon nitride, the rewrite efficiency can be further improved.

Silicon nanocrystal may be used for the charge-holding film. In this case, as shown in FIG. 22, dots of silicon nanocrystal 9d arranged to be discrete to each other are insulated by the top oxide film 9c. Since the silicon nanocrystal 9d has a characteristic that charges accumulated in the dots hardly move between the dots, charges are accumulated discretely similar to the case of the silicon nitride film 9b. The silicon nanocrystal 9d is formed on the bottom oxide film 9a in a self-assembled manner through low-pressure CVD at 600° C. to 800° C. using, for example, silane ($SiH_4$) as its source material. Thereafter, the top oxide film 9c is deposited through CVD to isolate and insulate the dots of the silicon nanocrystal 9d.

Second Embodiment

Though the bottom oxide film 9a as a part of the gate insulating film 9 is formed by using both the thermal oxidation and CVD method in the first embodiment described above, it is also possible to form the bottom oxide film 9a in the following manner.

First, the select gate 8 is formed through the process shown in FIG. 4 to FIG. 7 of the first embodiment described above, and subsequently, the surface of the substrate 1 (p-type well 3) is cleaned by the isotropic dry etching. When forming the select gate 8, the amount of overetching on the substrate 1 is suppressed so that the height difference between the surface of the substrate 1 and the bottom surface of the select gate 8 is made extremely small.

Next, as shown in FIG. 23, after the bottom oxide film 9a is formed through thermal CVD, the silicon nitride film 9b to be a part of the gate insulating film 9 (charge-holding film) is formed on the bottom oxide film 9a. When forming the bottom oxide film 9a through thermal CVD, the film is filmed in a low-temperature condition of 900° C. or lower, more preferably, 700° C. or lower. As a result, since it is possible to suppress the progress of the thermal oxidation toward the depth direction of the substrate 1, similar to the first embodiment described above, the interface between the bottom oxide film 9a and the silicon nitride film 9b is located at a position as high as or higher than that of the interface between the substrate 1 and the gate insulating film 7. Further, the gate insulating film 7 and the bottom oxide film 9a are successively and smoothly jointed in the neighborhood of the bottom part of the select gate 8. The method to form the bottom oxide film 9a is not limited to the thermal CVD as long as the film is formed in a low-temperature condition of 900° C. or lower, more preferably, 700° C. or lower. For example, plasma CVD, atomic layer deposition or the like can be used.

Moreover, when the reliability of the bottom oxide film 9a deposited at a low temperature is insufficient, after the bottom oxide film 9a is deposited, the bottom oxide film 9a can be oxidized again through ISSG oxidation at 700° C. to 1000° C. Alternatively, the bottom oxide film 9a can be formed by alternately repeating the deposition of low-temperature CVD and the ISSG oxidation. In this regard, when ISSG oxidation is used, the thermal oxidation toward the depth direction of the substrate 1 tends to progress more readily in comparison to the low-temperature CVD. Therefore, if it poses a problem, the annealing in an atmosphere containing nitride, hydrogen, deuterium and the like or in vacuum at 400° C. to 1000° C. may be performed in the midst of or after depositing the bottom oxide film 9a through low-temperature CVD.

According to the present embodiment, similar to the first embodiment described above, it is possible to mitigate the localization in electron distribution in the writing. Therefore, the rewrite tolerability of the memory cell can be improved. Note that, also in the present embodiment, metal oxides, metal silicates, silicon nanocrystal and the like can be used as the charge-holding film formed on the bottom oxide film 9a.

Third Embodiment

It is also possible to form the bottom oxide film 9a in the following manner. First, the select gate 8 is formed through the process shown in FIG. 4 to FIG. 7 of the first embodiment described above. When forming the select gate 8, it is preferable to suppress the amount of overetching of the substrate 1 so that the height difference between the surface of the substrate 1 and the bottom surface of the select gate 8 is made small.

Next, as shown in FIG. 24, a silicon oxide film 9e having a thickness of about 2 to 7 nm is formed on the respective surfaces of the substrate 1 (p-type well 3) and the select gate 8 through thermal oxidation. As the thermal oxidation, ISSG oxidation, dry oxidation, wet oxidation, and plasma oxidation and the like can be used.

Next, as shown in FIG. 25, the silicon oxide film 9e is anisotropically dry-etched so as to leave the silicon oxide film 9e on the sidewall of the select gate 8 and expose the surface of the substrate 1 (p-type well 3). Subsequently, as the substrate cleaning, the surface of the substrate 1 is isotropically dry-etched to remove the damages on the surface of the substrate 1 caused by the dry etching. In the dry etching of the silicon oxide film 9e, the amount of overetching of the substrate 1 is suppressed to 1 to 3 nm. Further, also in the isotropic dry etching of the substrate 1, the amount of overetching of the substrate 1 is suppressed to 1 to 3 nm.

Next, as shown in FIG. 26, a silicon epitaxial layer 11 is formed on the surface of the substrate 1 (p-type well 3) exposed by the etching described above. The silicon epitaxial layer 11 is formed through CVD using dichlorosilane ($SiH_2Cl_2$) as its material gas and a mixed gas of hydrogen and hydrogen chloride as its carrier gas in a temperature condition of 600° C. to 1100° C. The silicon epitaxial layer 11 has a thickness of about 5 to 20 nm, and the silicon epitaxial layer 11 is designed so that a surface thereof is located at a position higher than that of the interface between the substrate 1 and the gate insulating film 7.

Next, as shown in FIG. 27, the substrate 1 is subjected to thermal oxidation, thereby transforming a part or whole of the silicon epitaxial layer 11 into a silicon oxide film. By this means, the bottom oxide film 9a having a thickness of about 2 to 7 nm is formed on the surface of the substrate 1 (p-type well 3). As the thermal oxidation, ISSG oxidation, dry oxidation, wet oxidation, plasma oxidation and the like described above can be used. Further, after the bottom oxide film 9a is formed, in order to improve the reliability thereof, annealing can be performed in an atmosphere containing nitrogen, hydrogen, deuterium and the like or in vacuum as described above.

By forming the bottom oxide film 9a through the procedure described above, an upper surface of the bottom oxide film 9a is located at a position as high as or higher than that of the interface between the substrate 1 and the gate insulating film 7. Therefore, when the silicon nitride film 9b is formed on the bottom oxide film 9a in the subsequent process, the interface between the bottom oxide film 9a and the silicon nitride film 9b is located at a position as high as or higher than that of the interface between the substrate 1 and the gate insulating film 7. Further, the gate insulating film 7 and the bottom oxide film 9a are successively and smoothly jointed in the neighborhood of the bottom part of the select gate 8.

According to the present embodiment, similar to the first embodiment described above, it is possible to mitigate the localization in electron distribution in the writing. Therefore, the rewrite tolerability of the memory cell can be improved. Note that, also in the present embodiment, metal oxides, metal silicates, silicon nanocrystal and the like can be used as the charge-holding film formed on the bottom oxide film 9a.

In the foregoing, the invention made by the inventors of the present invention has been concretely described based on the embodiments. However, it is needless to say that the present invention is not limited to the foregoing embodiments and various modifications and alterations can be made within the scope of the present invention.

The present invention is applicable to a non-volatile memory mountable on a microcomputer.

What is claimed is:

1. A method of manufacturing a semiconductor device comprising a plurality of memory cells arrayed on a semiconductor substrate of a first conductivity type, wherein each of the memory cells includes
a select gate formed on the semiconductor substrate with a first gate insulating film interposed therebetween;
a memory gate formed on one sidewall of the select gate and insulated from the select gate and the semiconductor substrate via a second gate insulating film;
a semiconductor region of a second conductivity type that operates as a source region in a writing operation and is formed in the semiconductor substrate adjacent to the select gate; and
a semiconductor region of the second conductivity type that operates as a drain region in a writing operation and is formed in the semiconductor substrate adjacent to the memory gate,
wherein the second gate insulating film is configured to include at least a potential barrier film and a charge-holding film stacked on the potential barrier film,
wherein a process to form the memory cell includes the steps of:
(a) forming the select gate on the semiconductor substrate with the first gate insulating film interposed therebetween by etching, wherein an amount of overetching of the substrate is suppressed to approximately 1 to 3 nm;
(b) forming the second gate insulating film including at least the potential barrier film and the charge-holding film so as to cover a surface of the semiconductor substrate and a surface of the select gate;
(c) forming the memory gate on one sidewall of the select gate by patterning a conductive film formed on the second gate insulating film;
(d) leaving the second insulating film between the sidewall of the select gate and the memory gate and between the semiconductor substrate and the memory gate by patterning the second gate insulating film; and
(e) forming the source region formed of the semiconductor region of the second conductivity type in the semiconductor substrate adjacent to the select gate and forming the drain region formed of the semiconductor region of the second conductivity type in the semiconductor substrate adjacent to the memory gate by introducing an impurity into the semiconductor substrate, and wherein, in the step (b), the second gate insulating film is formed so that an interface between the potential barrier film and the charge-holding film in a neighborhood of a bottom part of the select gate is located at a position as high as or higher than an interface between the semiconductor substrate and the first gate insulating film.

2. The method of manufacturing a semiconductor device according to claim 1,
wherein the potential-barrier film is formed by forming a first silicon oxide film by thermally oxidizing the semiconductor substrate and then depositing a second silicon oxide film on the first silicon oxide film by vapor-phase deposition method, and
wherein a thickness of the potential-barrier film is controlled so that an upper surface of the potential barrier film in the neighborhood of a bottom part of the select gate is located at a position as high as or higher than that of an interface between the semiconductor substrate and the first gate insulating film.

3. The method of manufacturing a semiconductor device according to claim 2,
wherein the first silicon oxide film is formed by ISSG oxidation, dry oxidation, wet oxidation, or plasma oxidation, and the second silicon oxide film is formed by CVD method or atomic layer deposition.

4. The method of manufacturing a semiconductor device according to claim 2 further comprising the step of:
annealing the potential-barrier film after forming the potential-barrier film and before the step of forming the charge-holding film.

5. The method of manufacturing a semiconductor device according to claim 1,
wherein the charge-holding film is comprised of a silicon nitride film.

6. The method of manufacturing a semiconductor device according to claim 1,
wherein the charge-holding film is comprised of a metal oxide or a metal silicate of either one of metals selected from a group including tantalum, titanium, zirconium, hafnium, lanthanum, and aluminum.

7. The method of manufacturing a semiconductor device according to claim 1,
wherein the charge-holding film is comprised of silicon nanocrystals discretely arranged in an insulating film.

8. The method of manufacturing a semiconductor device according to claim 1,
wherein the potential-barrier film is formed by thermally oxidizing the semiconductor substrate at a temperature of 900° C. or lower, more preferably, 700° C. or lower.

* * * * *